(12) United States Patent
Lin et al.

(10) Patent No.: US 9,425,308 B2
(45) Date of Patent: Aug. 23, 2016

(54) POWER SEMICONDUCTOR DEVICE AND METHOD FOR FABRICATING THE SAME

(71) Applicant: DELTA ELECTRONICS, INC., Taoyuan Hsien (TW)

(72) Inventors: Li-Fan Lin, Taoyuan Hsien (TW); Wen-Chia Liao, Taoyuan Hsien (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 14/144,999

(22) Filed: Dec. 31, 2013

(65) Prior Publication Data

US 2015/0187932 A1     Jul. 2, 2015

(51) Int. Cl.

| | | |
|---|---|---|
| *H01L 21/331* | (2006.01) | |
| *H01L 29/78* | (2006.01) | |
| *H01L 29/66* | (2006.01) | |
| *H01L 29/778* | (2006.01) | |
| *H01L 23/532* | (2006.01) | |
| *H01L 29/417* | (2006.01) | |
| *H01L 29/20* | (2006.01) | |
| *H01L 23/528* | (2006.01) | |

(52) U.S. Cl.
CPC ...... *H01L 29/7816* (2013.01); *H01L 23/53295* (2013.01); *H01L 29/66681* (2013.01); *H01L 29/7786* (2013.01); *H01L 23/5283* (2013.01); *H01L 29/2003* (2013.01); *H01L 29/41758* (2013.01); *H01L 2924/0002* (2013.01)

(58) Field of Classification Search
CPC .... H01L 23/522; H01L 23/5226; H01L 23/28
USPC .................................................. 257/341, 774
See application file for complete search history.

(56) References Cited

U.S. PATENT DOCUMENTS

| | | | |
|---|---|---|---|
| 7,208,791 B2 * | 4/2007 | Oh et al. ........................ 257/306 |
| 2009/0064785 A1 * | 3/2009 | Fukuda et al. ............. 73/514.32 |
| 2010/0252796 A1 * | 10/2010 | Noshiro ............................ 257/4 |
| 2012/0091520 A1 * | 4/2012 | Nakamura .................... 257/303 |

* cited by examiner

*Primary Examiner* — Tan N Tran
(74) *Attorney, Agent, or Firm* — Muncy, Geissler, Olds & Lowe, P.C.

(57) ABSTRACT

A power semiconductor device and a method for fabricating the same are provided. The power semiconductor device includes a substrate and an active layer on the substrate. A gate electrode is disposed on the active layer. A first electrode and a second electrode are disposed on the active layer, on opposite sides of the gate electrode. A first metal pattern is coupled to the first electrode. A second metal pattern is coupled to the second electrode. A first insulating layer is disposed on the first and second metal patterns. A third metal pattern covers the first insulating layer, coupled to the second metal pattern. An interface between the third metal pattern and the first insulating layer is a substantially planar surface.

21 Claims, 7 Drawing Sheets

POWER SEMICONDUCTOR DEVICE AND METHOD FOR FABRICATING THE SAME

BACKGROUND OF THE INVENTION

1. Field of the Invention

The present invention relates to a power semiconductor device and a method for fabricating the same, and in particular to a design of a source metal pattern and a drain metal pattern of a power semiconductor device and a method for fabricating the same

2. Description of the Related Art

A power semiconductor device is a semiconductor device used as a switch or rectifier in power electronics. For example, a switch-mode power supply. The power semiconductor device is also called a power device or, when used in an integrated circuit (IC), a power IC. For improving switching speed, conventional power semiconductor devices utilize field-effect transistors as switching devices. Further, field-effect transistors have lower resistance, and thus power efficiency is improved.

For the lower resistance and large current transmission requirements, electrical connection patterns of the power semiconductor device have a wider dimension. However, interlayer dielectric layers (ILDs) or intermetal dielectric layers (IMDs) have a thickness that is difficult to improve. A point discharge occurs between source metal patterns and drain metal patterns in different layered levels, thereby resulting in the device experiencing early breakdown problems.

BRIEF SUMMARY OF THE INVENTION

The present disclosure provides a power semiconductor device and a method for fabricating the same. An exemplary embodiment of a power semiconductor device includes a substrate and an active layer on the substrate. A gate electrode is disposed on the active layer. A first electrode and a second electrode are disposed on the active layer, on opposite sides of the gate electrode. A first metal pattern is coupled to the first electrode. A second metal pattern is coupled to the second electrode. A first insulating layer is disposed on the first and second metal patterns. A third metal pattern covers the first insulating layer, coupled to the second metal pattern. An interface between the third metal pattern and the first insulating layer is a substantially planar surface.

An exemplary embodiment of a method for fabricating a power semiconductor device includes providing a substrate with an active layer thereon. A first gate electrode strip, a second gate electrode strip, a source electrode strip, a first drain electrode strip and a second drain electrode strip are formed on the active layer. The first gate electrode strip is between the first drain electrode strip and the source electrode strip. The second gate electrode strip is between the second drain electrode strip and the source electrode strip. A first metal pattern is formed coupled to the source electrode strip. Two second metal patterns are respectively formed coupled to the first drain electrode strip and a second drain electrode strip. A first insulating layer is formed on the first metal pattern and the two second metal patterns. A planarization process is performed to remove a portion of the second insulating layer, thereby forming a planarized first insulating layer. A third metal pattern is formed on the planarized first insulating layer, coupled to the first drain electrode strip and the second drain electrode strip. An interface between the third metal pattern and the planarized first insulating layer is a substantially planar surface.

Another exemplary embodiment of a method for fabricating a power semiconductor device includes providing a substrate with an active layer thereon. A first gate electrode strip, a second gate electrode strip, a source electrode strip, a first drain electrode strip and a second drain electrode strip are formed on the active layer. The first gate electrode strip is between the first drain electrode strip and the source electrode strip. The second gate electrode strip is between the second drain electrode strip and the source electrode strip. A first metal pattern is formed coupled to the source electrode strip. Two second metal patterns are respectively formed coupled to the first drain electrode strip and a second drain electrode strip. A first insulating layer is formed on the first metal pattern and the two second metal patterns. A planarization process is performed to remove a portion of the second insulating layer, thereby forming a planarized first insulating layer. A third metal pattern is formed on the planarized first insulating layer, coupled to the first drain electrode strip and the second drain electrode strip. An interface between the third metal pattern and the planarized first insulating layer is a substantially planar surface.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

In some embodiments, a power semiconductor device and a method for fabricating the same are provided. The power semiconductor device includes a gate electrode, a source electrode and a drain electrode. The source electrode and the drain electrode are disposed on opposite sides of the gate electrode. A source metal pattern is coupled to the source electrode, and a drain metal pattern is coupled to the drain electrode. In some embodiments, the source metal pattern and the drain metal pattern at the uppermost layered level are designed to be at different sides (the source side or the drain side) of the power semiconductor device. Therefore, the source metal pattern and the drain metal pattern can be designed to have a wider dimension (for example, a width and/or a thickness) for large current transmission requirements. In some embodiments, an interface between the source metal pattern and/or the drain metal pattern and underlying insulating layer (for example, interlayer dielectric (ILD) or inter-metal dielectric (IMD)) is a substantially planar surface except for portions formed through the insulating layer. A point discharge that occurs between the source metal pattern and the drain metal pattern can be avoided. Therefore, the source metal pattern and the drain metal pattern can be designed to have a large thickness without the device's early breakdown problems.

Figure 1:
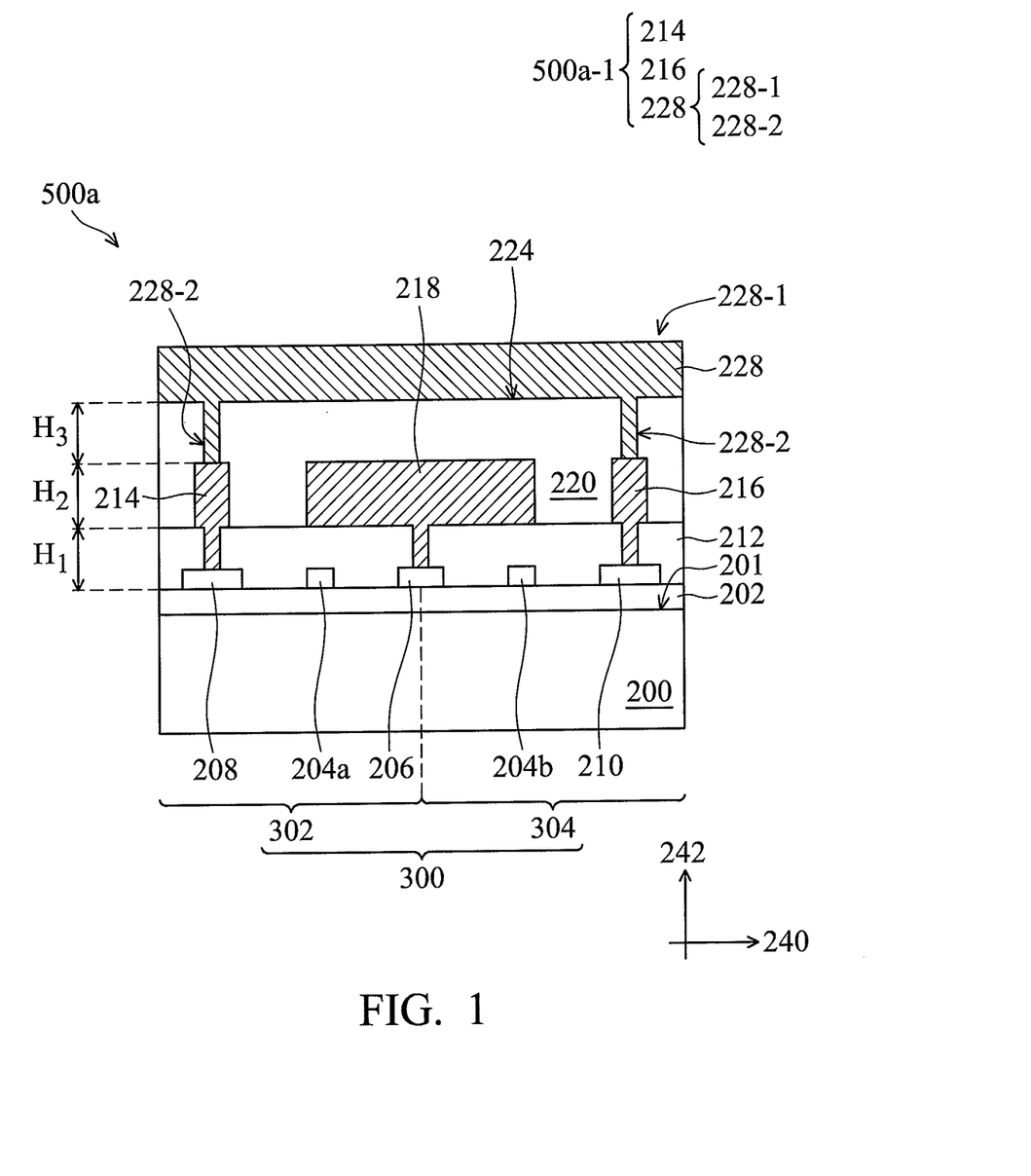
FIG. 1 is cross-sectional view of an electrical connection for a drain side of a power semiconductor device in accordance with some embodiments of the disclosure.

FIG. 1 is cross-sectional view of an electrical connection 500a-1 for a drain side of power semiconductor device 500a in accordance with some embodiments of the disclosure. In some embodiments, the power semiconductor device 500a includes a substrate 200 and a field effect transistor (FET). In some embodiments, the substrate 200 includes a semiconductor substrate, such as a silicon substrate. The field effect transistor (FET) is formed on the substrate 200. In some embodiments, the FET includes an active layer 202 formed on a top of the substrate 200. In some embodiments, the power semiconductor device 500a comprises a plurality of FETs, such as a first FET 302 and a second FET 304, arranged in an array 300. In some embodiments, the active layer 202 includes a plurality of nitride-based semiconductor layers stacked on each other, and a conductive channel of high density 2-dimensional electric gas (2DEG). In some embodiments, the active layer 202 includes a gallium nitride layer and an aluminum gallium nitride layer disposed on the gallium nitride. The 2DEG channel is located adjacent to the interface between the gallium nitride layer and the aluminum gallium nitride layer.

As shown in FIG. 1, the first FET 302 includes a gate electrode 204a, a first electrode 206 and a second electrode 208 in accordance with some embodiments. The second FET 304 includes a gate electrode 204b, a first electrode 206 and a second electrode 210 in accordance with some embodiments. In some embodiments, the first electrode 206 serves as a commonly used source electrode for the first FET 302 and the second FET 304. The second electrode 208 of the first FET 302 serves as a drain electrode for the first FET 302. Also, the second electrode 210 of the second FET 304 serves as a drain electrode for the second FET 304. In some embodiments, the gate electrode 204a, the first electrode 206 and the second electrode 208 of the first FET 302 are disposed on the active layer 202. The gate electrode 204b, the first electrode 206 and the second electrode 210 of the second FET 304 are disposed on the active layer 202. The first electrode 206 and the second electrode 208 are disposed on opposite sides of the gate electrode 204a of the first FET 302. The first electrode 206 and a second electrode 210 are disposed on opposite sides of gate electrode 204b of the second FET 304.

As shown in FIG. 1, an insulating layer 212 is disposed over the active layer 202 in accordance with some embodiments. Also, the insulating layer 212 is disposed over the first electrode 206 and second electrodes 208, 210. The gate electrodes 204a and 204b are separated from the first electrode 206 by the insulating layer 212. In some embodiments, the insulating layer 212 serves as an interlayer dielectric layer (ILD) for the power semiconductor device 500a. In some embodiments, the insulating layer 212 is formed of dielectric materials. For example, the insulating layer 212 includes silicon oxide or silicon nitride. In some embodiments, the insulating layer 212 is formed by a method including spin coating, chemical vapor deposition (CVD), physical vapor deposition (PVD), a thermal process, other applicable processes, or combinations thereof. In some other embodiments, a planarization process including a chemical mechanical polishing (CMP) process is performed on the insulating layer 212 to planarize a surface of the insulating layer 212

As shown in FIG. 1, one or more first metal pattern 218 and second metal patterns 214 and 216 are disposed over the insulating layer 202 in accordance with some embodiments. In some embodiments, the first metal pattern 218 and second metal patterns 214 and 216 serve as electrical interconnections for the source electrode (for example, the first electrode 206) and the drain electrode (for example, the second electrodes 208 and 210) of the first FET 302 and the second FET 304. In some embodiments, the first metal pattern 218 and second metal patterns 214 and 216 belong to a first metal-layered level (also labeled M1). In some embodiments, the first metal pattern 218 is formed through the insulating layer 220 to couple to the first electrode 206, which is a commonly used source electrode for the first FET 302 and the second FET 304. The second metal pattern 214 is formed through the insulating layer 212 to couple to the second electrode 208, which serves as a drain electrode for the first FET 302. The second metal pattern 216 is formed through the insulating layer 220 to couple to the second electrode 210, which serves as a drain electrode for the second FET 304. In some embodiments, the first metal pattern 218 and second metal patterns 214 and 216 are formed of conductive materials, for example, aluminum (Al), copper (Cu) other applicable conductive materials or combinations thereof. In some embodiments, the first metal pattern 218 and second metal patterns 214 and 216 are formed by a patterning process and a subsequent plating process. The patterning process includes a photolithography process and a subsequent etching process. The patterning process is used to remove a portion of the insulating layer 212, thereby forming openings (not shown) through the insulating layer 212. Portions of the first electrode 206 and the second electrodes 208 and 210 are exposed to the openings. The photolithography process is used to define formation positions of the first metal pattern 218 and second metal patterns 214 and 216 over the insulating layer 220. The plating method includes an electro-plating process, electroless-plating process, other applicable processes or combinations thereof to deposit a conductive material over the insulating layer 220 and fill the openings.

In some embodiments, the first electrode 206 (the source electrode) of the first FET 302 and the second FET 304 is designed to couple to external circuits through the first metal pattern 218 at the first metal-layered level (also labeled M1) at the source side of the first FET 302 and the second FET 304 as shown in FIG. 1. Also, the second electrodes 208 and 210 (the drain electrode) of the first FET 302 and the second FET 304 are designed to couple to external circuits through the second metal patterns 214 and 216 at the first metal-layered level (also labeled M1) and another metal pattern at a second metal-layered level (also labeled M2) different from the first metal-layered level (M1) at the drain side of the first FET 302 and the second FET 304 as shown in FIG. 1. For example as shown in FIG. 1, the second metal-layered level (M2) is higher than the first metal-layered level (M1). Therefore, a cross-sectional area of the first metal pattern 218 can be designed to have a large width and thickness for large current transmission requirements. In some embodiments, the first metal pattern 218 may be designed to fan out with a wide width. As shown in FIG. 1, the first metal pattern 218 overlaps with the gate electrode 204a of the first FET 302 and the gate electrode 204b of the second FET 304 to serve as a field plate and improve the breakdown voltage of the first FET 302 and the second FET 304. Also, the first metal pattern 218 may be T-shaped in a cross-sectional view, as in FIG. 1. In some embodiments, a thickness H2 of the first electrode 206 and the second metal patterns 214 and 216 are designed to be the same as a thickness H1 of the insulating layer 202.

As shown in FIG. 1, an insulating layer 220 is disposed over the first metal pattern 218 and second metal patterns 214 and 216 in accordance with some embodiments. Also, the insulating layer 220 is disposed over the insulating layer 212. In some embodiments, the insulating layer 220 serves as an inter-metal dielectric layer (IMD) for the power semiconductor device 500a. In some embodiments, the insulating layer 220 is formed of dielectric materials. For example, the insulating layer 220 includes insulating materials such as silicon oxide, silicon nitride, other applicable insulating materials, or combinations thereof. In some embodiments, the insulating layer 220 is formed by a deposition process and a subsequent planarization process. The deposition process, which is used to deposit the insulating materials, includes spin coating, chemical vapor deposition (CVD), physical vapor deposition (PVD), a thermal process, other applicable processes, or combinations thereof. In some embodiments, a thickness H3 of a portion of the insulating layer 220 over the second metal patterns 214 and 216 is designed to be the same as the thickness H2 of the first electrode 206 and the second metal patterns 214 and 216. Also, the thickness H3 is designed to be the same as the thickness H1 of the insulating layer 202. Also, the thickness H2 of the first electrode 206 and the second metal patterns 214 and 216 is designed to be the same as the thickness H1 of the insulating layer 202. Therefore, a top surface of the insulating layer 220 may have an uneven profile conforming to a profile of the first metal pattern 218 and the second metal patterns 214, 216. In some embodiments, the planarization process is performed to remove uneven portions of the insulating materials from a top surface of the insulating materials to ensure a top surface 224 of the insulating layer 220 is a substantially planar surface. The planarization process includes a chemical mechanical polishing (CMP) process, other applicable processes, or combinations thereof.

As shown in FIG. 1, a third metal pattern 228 covers the insulating layer 220, coupled to the drain sides of the first FET 302 and the second FET 304 in accordance with some embodiments. In some embodiments, the third metal pattern 228 is composed of a portion 228-1 and a portion 228-2. The portion 228-1 is extended along a first direction 240, and the portion 228-2 is extended along a second direction 242 as shown in FIG. 1. In some embodiments, the first direction 240 is substantially parallel to the top surface 224 of the insulating layer 220, and the second direction 242 is substantially perpendicular to the top surface 224 of the insulating layer 220. Therefore, the first direction 240 is substantially perpendicular to the second direction 242. In some embodiments, the portion 228-1 of the third metal pattern 228 is formed over the top surface 224 of the insulating layer 220, and the portion 228-2 is formed through the insulating layer 220 to couple to both the second electrodes 208 and 210 of the first FET 302 and the second FET 304. In some embodiments, the portion 228-1 of the third metal pattern 228 overlaps with the gate electrode 204a of the first FET 302 and the gate electrode 204b of the second PET 304. In some embodiments, the portion 228-1 of the third metal pattern 228 overlaps with the first metal pattern 218. Therefore, the first metal pattern 218 is vertically disposed between the gate electrodes 204a, 204b and the third metal pattern 228. In some embodiments, the third metal pattern 228 is formed of materials that are the same as those of the first metal pattern 218 and second metal patterns 214 and 216. In some embodiments, formation processes of the third metal pattern 228 are the same as those of the first metal pattern 218 and second metal patterns 214 and 216.

In some embodiments, the third metal pattern 228 at the second metal-layered level (also labeled M2) is electrically connected to the second metal patterns 214 and 216 at the first metal-layered level (also labeled M1) as shown in FIG. 1. The second metal patterns 214 and 216 and the third metal pattern 228 are composed of the electrical connection 500a-1 for a drain side of power semiconductor device 500a. It should be noted that no metal pattern at the second metal-layered level (M2) is designed to electrically connect to the first metal pattern 218 at the first metal-layered level (M1) at the drain side of the power semiconductor device 500a. The electrical connection 500a-1 is provided as an electrical connection between the external circuits and the second electrodes 208 and 210 (the drain electrode) of the first FET 302 and the second FET 304. Therefore, a cross-sectional area of the third metal pattern 228 can be designed to have a large width and thickness for large current transmission requirements. In some embodiments, the portion 228-1 of the third metal pattern 228 may be designed to fan out with a wide width along the first direction 240. Also, the top surface 224 of the insulating layer 220, which is substantially parallel to the first direction 240, is designed to be a substantially planar surface by the planarization process (for example, a CMP process). Therefore, an interface (located at a position of the top surface 224 of the insulating layer 220) between the portion 228-1 of the third metal pattern 228 and the insulating layer 220 at the drain sides of the first FET 302 and the second FET 304 is a substantially planar surface. Accordingly, the portion 228-1 of the third metal pattern 228 does not have any sharp corners at the interface. The point discharge that occurs between the source metal pattern (the first metal pattern 218) and the drain metal pattern (the third metal pattern 228) can be avoided.

Figure 2:
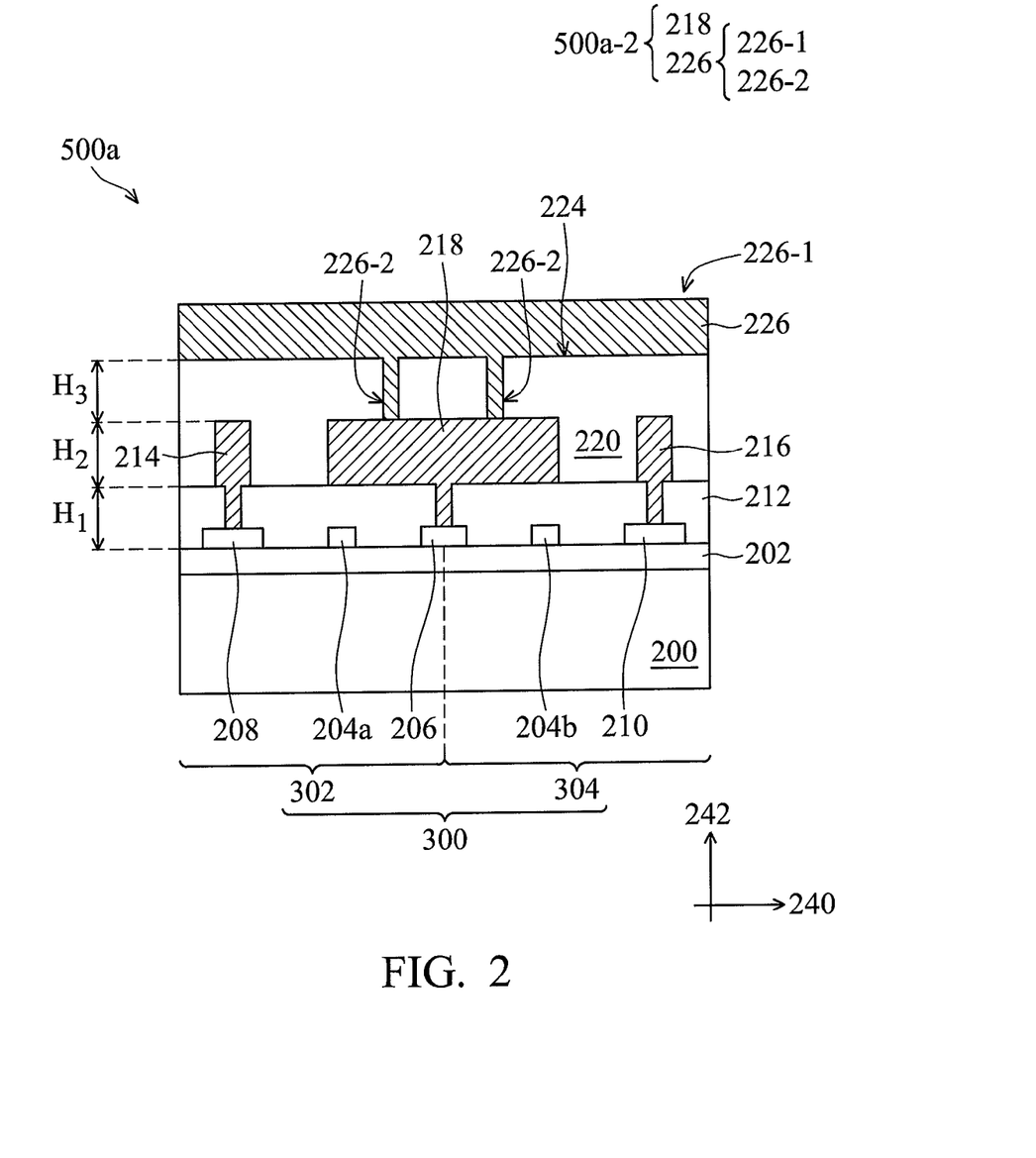
FIG. 2 is cross-sectional view of an electrical connection for a source side of a power semiconductor device in accordance with some embodiments of the disclosure.

FIG. 2 is cross-sectional view of an electrical connection 500a-2 for a source side of the power semiconductor device 500a in accordance with some embodiments of the disclosure. Elements of the embodiments that are the same or similar as those previously described with reference to FIG. 1 are not repeated hereinafter for brevity. It should be noted that no metal pattern at the second metal-layered level (M2) is designed to electrically connect to the second metal patterns 214 and 216 at the first metal-layered level (M1) at the source side of the power semiconductor device 500a as shown in FIG. 2.

As shown in FIG. 2, a fourth metal pattern 226 is disposed on the insulating layer 220 and coupled to the first metal pattern 218 at the source side of the power semiconductor device 500a in accordance with some embodiments. As shown in FIG. 2, a fourth metal pattern 226 covers the insulating layer 220 at the source side of the first FET 302 and the second FET 304 in accordance with some embodiments. In some embodiments, the fourth metal pattern 226 is composed of a portion 226-1 and a portion 226-2. The portion 226-1 is extended along the first direction 240, and the portion 226-2 is extended along the second direction 242 as shown in FIG. 2. In some embodiments, the first direction 240 is substantially parallel to the top surface 224 of the insulating layer 220, and the second direction 242 is substantially perpendicular to the top surface 224 of the insulating layer 220. Therefore, the first direction 240 is substantially perpendicular to the second direction 242. In some embodiments, the portion 226-1 of the fourth metal pattern 226 is formed over the top surface 224 of the insulating layer 220, and the portion 226-2 is formed through the insulating layer 220 to couple to the first metal pattern 218. The first metal pattern 218 is used to in contact with first electrode 206, which serves as a commonly used source electrode for the first FET 302 and the second FET 304. In some embodiments, the portion 226-1 of the fourth metal pattern 226 overlaps with the gate electrode 204a of the first FET 302 and the gate electrode 204b of the second FET 304. In some embodiments, the portion 226-1 of the fourth metal pattern 226 overlaps with the first metal pattern 218. Therefore, the first metal pattern 218 is vertically disposed between the gate electrodes 204a, 204b and the fourth metal pattern 226. In some embodiments, the fourth metal pattern 226 is formed of materials that are the same as those of the first metal pattern 218, the second metal patterns 214, 216 and the third metal pattern 228. In some embodiments, formation processes of the third metal pattern 228 are the same as those of the first metal pattern 218, the second metal patterns 214, 216 and the third metal pattern 228.

In some embodiments, the fourth metal pattern 226 at the second metal-layered level (also labeled M2) is electrically connected to the first metal pattern 218 at the first metal-layered level (also labeled M1) as shown in FIG. 2. The first metal pattern 218 and the fourth metal pattern 226 are composed of the electrical connection 500a-2 for a source side of power semiconductor device 500a. The electrical connection 500a-2 is provided as an electrical connection between the external circuits and the first metal pattern 218 (the source electrode) of the first FET 302 and the second FET 304. Therefore, a cross-sectional area of the fourth metal pattern 226 can be designed to have a large width and thickness for large current transmission requirements. In some embodiments, the portion 226-1 of the fourth metal pattern 226 may be designed to fan out with a wide width along the first direction 240. Also, the top surface 224 of the insulating layer 220, which is substantially parallel to the first direction 240, is designed to be a substantially planar surface by the planarization process (for example, a CMP process). Therefore, an interface (located at a position of the top surface 224 of the insulating layer 220) between the portion 226-1 of the fourth metal pattern 226 and the insulating layer 220 at the source side of the first FET 302 and the second FET 304 is a substantially planar surface. Accordingly, the portion 226-1 of the fourth metal pattern 226 does not have any sharp corners at the interface. The point discharge that occurs between the drain metal pattern (the second metal pattern 214 and 216) and the source metal pattern (the fourth metal pattern 226) can be avoided.

Figure 3:
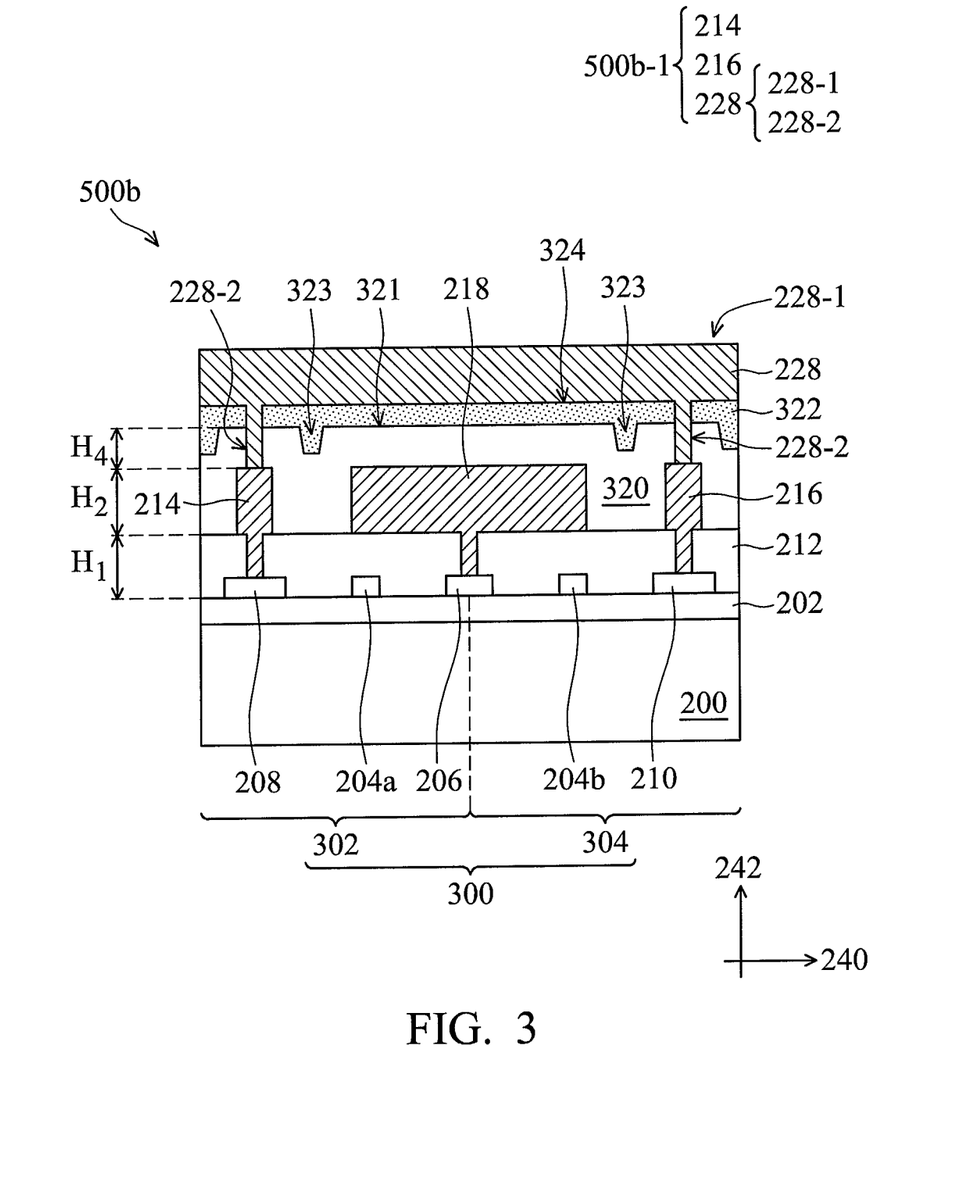
FIG. 3 is cross-sectional view of an electrical connection for a drain side of a power semiconductor device in accordance with some other embodiments of the disclosure.

FIG. 3 is cross-sectional view of an electrical connection 500b-1 for a drain side of a power semiconductor device 500b in accordance with some embodiments of the disclosure. Elements of the embodiments that are the same or similar as those previously described with reference to FIGS. 1-2 are not repeated hereinafter for brevity. It should be noted that no metal pattern at the second metal-layered level (M2) is designed to electrically connect to the first metal pattern 218 at the first metal-layered level (M1) at the drain side of the power semiconductor device 500b.

As shown in FIG. 3, an insulating layer 320 is disposed over the first metal pattern 218 and second metal patterns 214 and 216 in accordance with some embodiments. Also, the insulating layer 320 is disposed over the insulating layer 212. In some embodiments, the insulating layer 320 serves as an inter-metal dielectric layer (IMD) for the power semiconductor device 500b. In some embodiments, the insulating layer 320 is formed of dielectric materials. For example, the insulating layer 320 includes insulating materials such as silicon oxide, silicon nitride, other applicable insulating materials, or combinations thereof. In some embodiments, the insulating layer 320 is formed by a deposition process. The deposition process, which is used to deposit the insulating materials, includes spin coating, chemical vapor deposition (CVD), physical vapor deposition (PVD), a thermal process, other applicable processes, or combinations thereof. In some embodiments, a thickness H4 of a portion of the insulating layer 320 over the second metal patterns 214 and 216 is designed to be the same as the thickness H2. Also, the thickness H4 is designed to be the same as the thickness H1. Also, the thickness H2 of the first electrode 206 and the second metal patterns 214 and 216 is designed to be the same as the thickness H1 of the insulating layer 202. Therefore, a top surface 321 of the insulating layer 320 may have an uneven profile conforming to a profile of the first metal pattern 218 and the second metal patterns 214, 216. In some embodiments, the insulating layer 320 has one or more recess 323 close to the top surface 321.

As shown in FIG. 3, an insulating layer 322 is formed on the insulating layer 320, filling the recess 323 of the insulating layer 320 in accordance with some embodiments. A thickness of the insulating layer 322 is controlled such that a top surface 324 of the insulating layer 322 is a substantially planar surface. In some embodiments, the insulating layer 320 is formed of dielectric materials. For example, the insulating layer 220 is formed of insulating materials. The insulating materials, which are suitable for a coating process, include benzocyclobutene (BCB), spin on glass (SOG), polyimide (PI), photoresist (PR), other applicable insulating materials, or combinations thereof. In some embodiments, the insulating layer 320 is formed by a coating process and a subsequent baking process.

As shown in FIG. 3, a third metal pattern 228 covers the insulating layer 322 at the drain side of the first FET 302 and the second FET 304 in accordance with some embodiments. In some embodiments, the third metal pattern 228 is composed of a portion 228-1 and a portion 228-2. The portion 228-1 is extended along a first direction 240, and the portion 228-2 is extended along a second direction 242 as shown in FIG. 3. In some embodiments, the first direction 240 is substantially parallel to the top surface 324 of the insulating layer 322, and the second direction 242 is substantially perpendicular to the top surface 324 of the insulating layer 322. Therefore, the first direction 240 is substantially perpendicular to the second direction 242. In some embodiments, the portion 228-1 of the third metal pattern 228 is formed over the top surface 324 of the insulating layer 322, and the portion 228-2 is formed through the insulating layers 220 and 320 to couple to both the second electrodes 208 and 210 of the first FET 302 and the second FET 304. In some embodiments, the portion 228-1 of the third metal pattern 228 overlaps with the gate electrode 204a of the first FET 302 and the gate electrode 204b of the second FET 304. In some embodiments, the portion 228-1 of the third metal pattern 228 overlaps with the first metal pattern 218. Therefore, the first metal pattern 218 is vertically disposed between the gate electrodes 204a, 204b and the third metal pattern 228. In some embodiments, the third metal pattern 228 is formed of materials that are the same as those of the first metal pattern 218 and second metal patterns 214 and 216. In some embodiments, formation processes of the third metal pattern 228 are the same as those of the first metal pattern 218 and second metal patterns 214 and 216.

In some embodiments, the third metal pattern 228 at the second metal-layered level (also labeled M2) is electrically connected to the second metal patterns 214 and 216 at the first metal-layered level (also labeled M1) as shown in FIG. 3. The second metal patterns 214 and 216 and the third metal pattern 228 are composed of the electrical connection 500*b*-1 for a drain side of power semiconductor device 500*b*. The electrical connection 500*b*-1 is provided as an electrical connection between the external circuits and the second electrodes 208 and 210 (the drain electrode) of the first FET 302 and the second FET 304. Therefore, a cross-sectional area of the third metal pattern 228 can be designed to have a large width and thickness for large current transmission requirements. In some embodiments, the portion 228-1 of the third metal pattern 228 may be designed to fan out with a wide width along the first direction 240. Also, the top surface 324 of the insulating layer 322, which is substantially parallel to the first direction 240, is designed to be a substantially planar surface by the coating process and the subsequent baking process. Therefore, an interface (located at a position of the top surface 324 of the insulating layer 322) between the portion 228-1 of the third metal pattern 228 and the insulating layer 322 at the drain sides of the first FET 302 and the second FET 304 is a substantially planar surface. Accordingly, the portion 228-1 of the third metal pattern 228 does not have any sharp corners at the interface. The point discharge that occurs between the source metal pattern (the first metal pattern 218) and the drain metal pattern (the third metal pattern 228) can be avoided.

Figure 4:
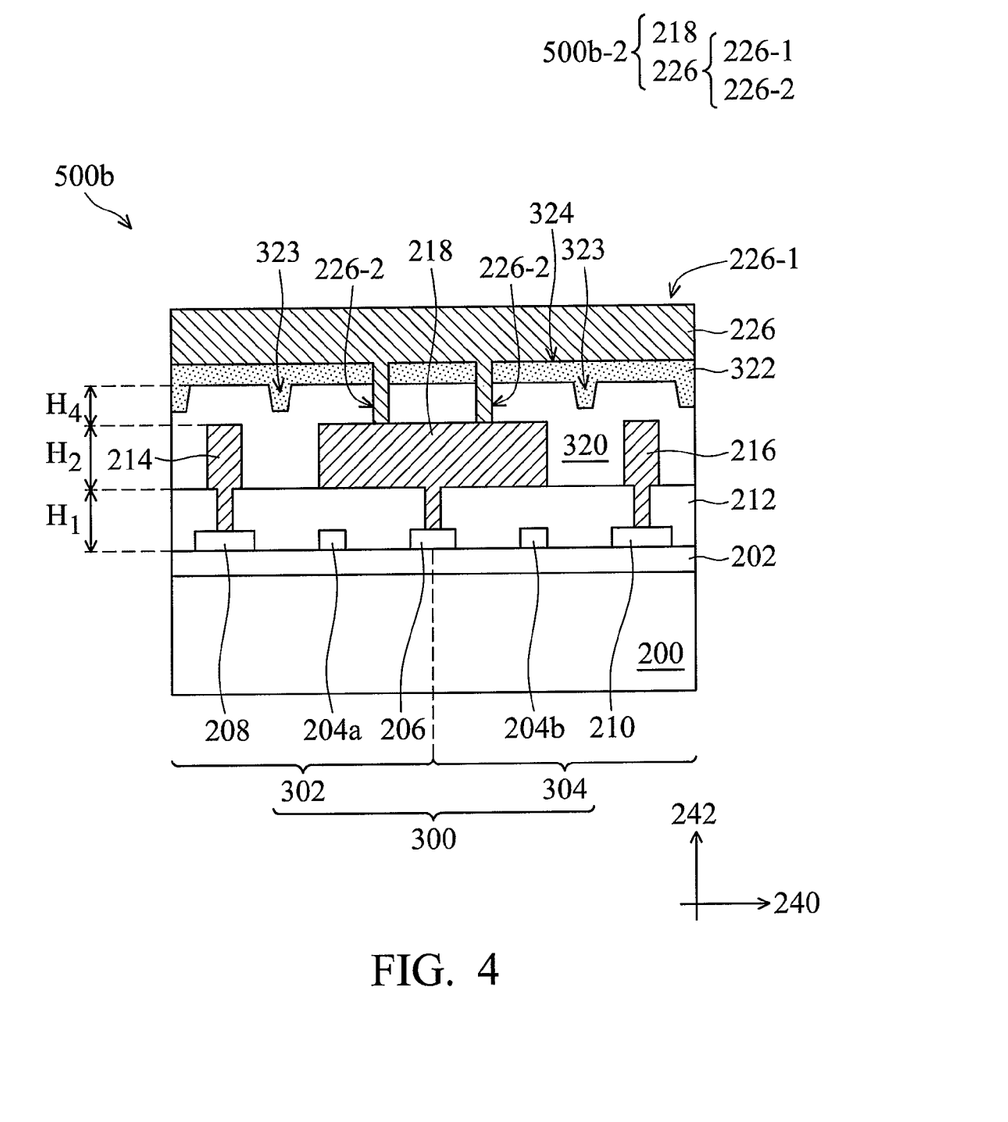
FIG. 4 is cross-sectional view of an electrical connection for a source side of a power semiconductor device in accordance with some other embodiments of the disclosure.

FIG. 4 is cross-sectional view of an electrical connection 500*b*-2 for a source side of the power semiconductor device 500*b* in accordance with some embodiments of the disclosure. Elements of the embodiments that are the same or similar as those previously described with reference to FIGS. 1-3 are not repeated hereinafter for brevity. It should be noted that no metal pattern at the second metal-layered level (M2) is designed to electrically connect to the second metal patterns 214 and 216 at the first metal-layered level (M1) at the source side of the power semiconductor device 500*b*.

As shown in FIG. 4, a fourth metal pattern 226 is disposed on the insulating layer 322 and coupled to the first metal pattern 218 at the source side of the power semiconductor device 500*b* in accordance with some embodiments. As shown in FIG. 4, a fourth metal pattern 226 covers the insulating layer 322 at the source side of the first FET 302 and the second FET 304 in accordance with some embodiments. In some embodiments, the fourth metal pattern 226 is composed of a portion 226-1 and a portion 226-2. The portion 226-1 is extended along the first direction 240, and the portion 226-2 is extended along the second direction 242 as shown in FIG. 4. In some embodiments, the first direction 240 is substantially parallel to the top surface 324 of the insulating layer 322, and the second direction 242 is substantially perpendicular to the top surface 324 of the insulating layer 322. Therefore, the first direction 240 is substantially perpendicular to the second direction 242. In some embodiments, the portion 226-1 of the fourth metal pattern 226 is formed over the top surface 324 of the insulating layer 322, and the portion 226-2 is formed through the insulating layer 220 and 320 to couple to the first metal pattern 218 of the first electrode 206. The first metal pattern 218 is used to in contact with first electrode 206, which serves as a commonly used source electrode for the first FET 302 and the second FET 304. In some embodiments, the portion 226-1 of the fourth metal pattern 226 overlaps with the gate electrode 204*a* of the first FET 302 and the gate electrode 204*b* of the second FET 304. In some embodiments, the portion 226-1 of the fourth metal pattern 226 overlaps with the first metal pattern 218. Therefore, the first metal pattern 218 is vertically disposed between the gate electrodes 204*a*, 204*b* and the fourth metal pattern 226. In some embodiments, the fourth metal pattern 226 is formed of materials that are the same as those of the first metal pattern 218, the second metal patterns 214, 216 and the third metal pattern 228. In some embodiments, formation processes of the fourth metal pattern 226 are the same as those of the first metal pattern 218, the second metal patterns 214, 216 and the third metal pattern 228.

In some embodiments, the fourth metal pattern 226 at the second metal-layered level (also labeled M2) is electrically connected to the first metal pattern 218 at the first metal-layered level (also labeled M1) as shown in FIG. 4. The first metal pattern 218 and the fourth metal pattern 226 are composed of the electrical connection 500*b*-2 for a source side of power semiconductor device 500*b*. The electrical connection 500*b*-2 is provided as an electrical connection between the external circuits and the first metal pattern 218 (the source electrode) of the first FET 302 and the second FET 304. Therefore, a cross-sectional area of the fourth metal pattern 226 can be designed to have a large width and thickness for large current transmission requirements. In some embodiments, the portion 226-1 of the fourth metal pattern 226 may be designed to fan out with a wide width along the first direction 240. Also, the top surface 324 of the insulating layer 322, which is substantially parallel to the first direction 240, is designed to be a substantially planar surface by the coating process and the subsequent baking process. Therefore, an interface (located at a position of the top surface 324 of the insulating layer 322) between the portion 226-1 of the fourth metal pattern 226 and the insulating layer 322 at the source side of the first FET 302 and the second FET 304 is a substantially planar surface. Accordingly, the portion 226-1 of the fourth metal pattern 226 does not have any sharp corners at the interface. The point discharge that occurs between the drain metal pattern (the second metal patterns 214 and 216) and the source metal pattern (the fourth metal pattern 226) can be avoided.

Figure 5:
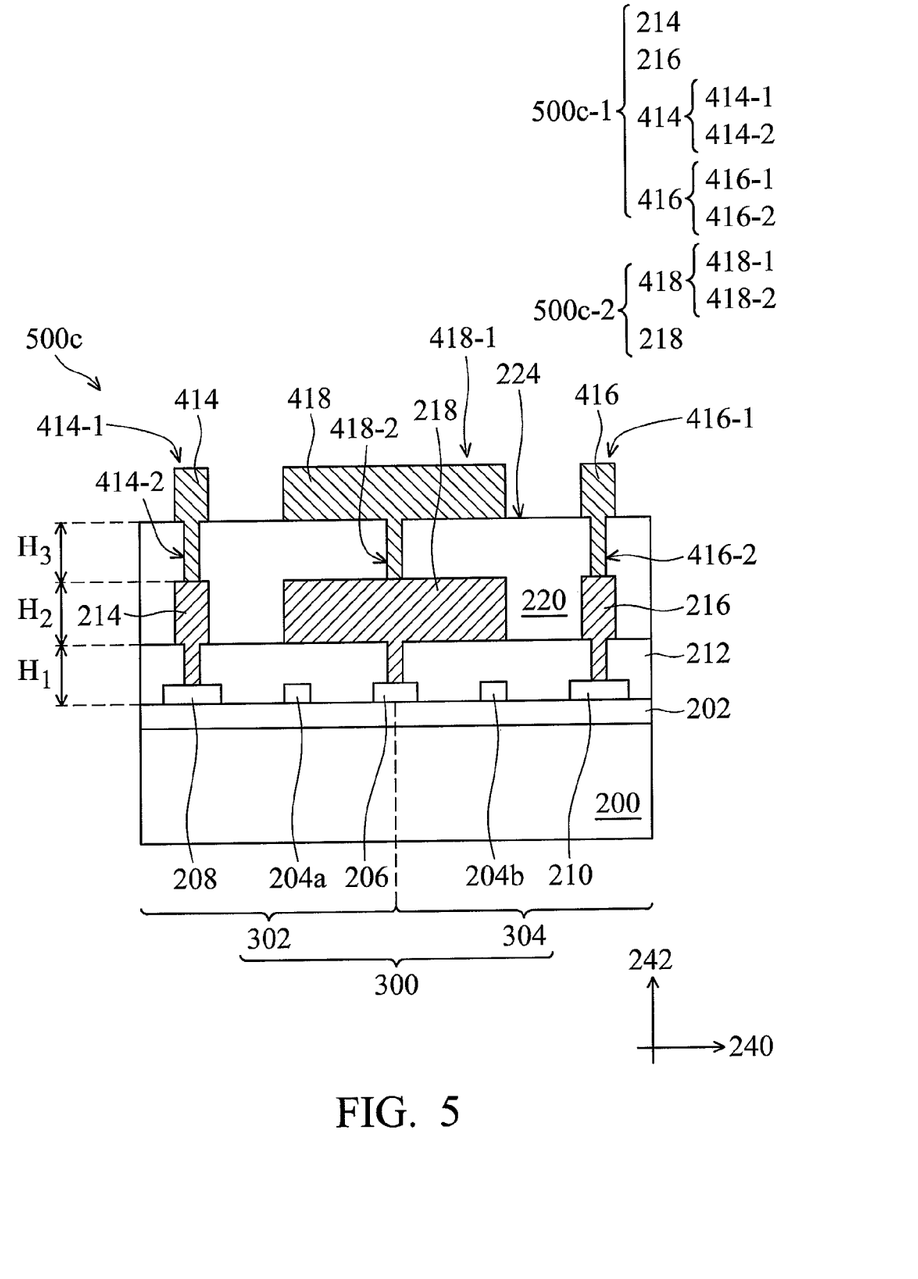
FIG. 5 is cross-sectional view of an electrical connection for a drain side and/or source side of a power semiconductor device in accordance with some other embodiments of the disclosure.

FIG. 5 is cross-sectional view of an electrical connection for a drain side and/or source side of a power semiconductor device 500*c* in accordance with some other embodiments of the disclosure. Elements of the embodiments that are the same or similar as those previously described with reference to FIGS. 1-4 are not repeated hereinafter for brevity. It should be noted that electrical connections are designed to be located at a single layered level (the first metal-layered level (M1) or the second metal-layered level (M2)) to electrically connect to both the source electrode (206) and the drain electrode (208/210) of the power semiconductor device 500*c*.

As shown in FIG. 5, fifth metal patterns 414, 416 and 418 cover the insulating layer 220 at the drain side or the source side of the first FET 302 and the second FET 304 in accordance with some embodiments. In some embodiments, the fifth metal pattern 414 is composed of a portion 414-1 and a portion 414-2. The fifth metal pattern 416 is composed of a portion 416-1 and a portion 416-2. The fifth metal pattern 418 is composed of a portion 418-1 and a portion 418-2. The portions 414-1, 416-1 and 418-1 are extended along a first direction 240. The portions 414-2, 416-2 and 418-2 are extended along a second direction 242 substantially perpendicular to the first direction 240, as shown in FIG. 5. In some embodiments, the portions 414-1, 416-1 and 418-1 of the fifth metal patterns 414, 416 and 418 are formed over the top surface 224 of the insulating layer 220. The portions 414-2, 416-2 and 418-2 are formed through the insulating layer 220 to respectively couple to the second electrodes 208, 210 and the first metal pattern of the first FET 302 and the second FET

304. In some embodiments, the portion 418-1 of the fifth metal pattern 418 overlaps with the gate electrode 204a of the first FET 302 and the gate electrode 204b of the second FET 304. In some embodiments, the portion 418-1 of the fifth metal pattern 418 overlaps with the first metal pattern 218. Therefore, the first metal pattern 218 is vertically disposed between the gate electrodes 204a, 204b and the third metal pattern 228. In some embodiments, the portions 414-1 and 416-1 of the fifth metal pattern 414 and 416 respectively overlap with the second metal patterns 214 and 216.

In some embodiments, the fifth metal patterns 414, 416 and 418 are formed of materials that are the same as those of the first metal pattern 218, the second metal patterns 214, 216, the third metal pattern 228 and the fourth metal pattern 226. In some embodiments, formation processes of the fifth metal patterns 414, 416 and 418 are the same as those of the first metal pattern 218, the second metal patterns 214, 216, the third metal pattern 228 and the fourth metal pattern 226.

In some embodiments, the fifth metal patterns 414 and 416 at the second metal-layered level (also labeled M2) are electrically connected to the second metal patterns 214 and 216 at the first metal-layered level (also labeled M1) as shown in FIG. 5. The second metal patterns 214, 216 and the fifth metal patterns 414, 416 are composed of the electrical connection 500c-1 for a drain side of the power semiconductor device 500c. Similarly, the fifth metal pattern 418 at the second metal-layered level (also labeled M2) is electrically connected to the first metal pattern 218 at the first metal-layered level (also labeled MD as shown in FIG. 5. The first metal pattern 218 and the fifth metal pattern 418 are composed of the electrical connection 500c-2 for a source side of the power semiconductor device 500c. It should be noted that the electrical connections 500c-1 and 500c-2 are at the same layered level (For example, M2).

The electrical connections 500c-1 and 500c-2, which are both designed at a single layered level (the second metal-layered level (M2)), are provided as an electrical connection between the external circuits and to electrically connect to both the source electrode 206 and the drain electrode 208/210 of the power semiconductor device 500c. Therefore, the point discharge that occurs between the source metal pattern and the drain metal pattern can be avoided.

In some other embodiments, the first metal pattern 218 and the second metal patterns 214, 216 can serve as electrical connections to electrically connect to both the source electrode (206) and the drain electrode (208/210) of the power semiconductor device 500c. Because the first metal pattern 218 and the second metal patterns 214, 216 are designed at a single layered level (the first metal-layered level (M1)). The point discharge that occurs between the source metal pattern and the drain metal pattern can be avoided.

Figure 6:
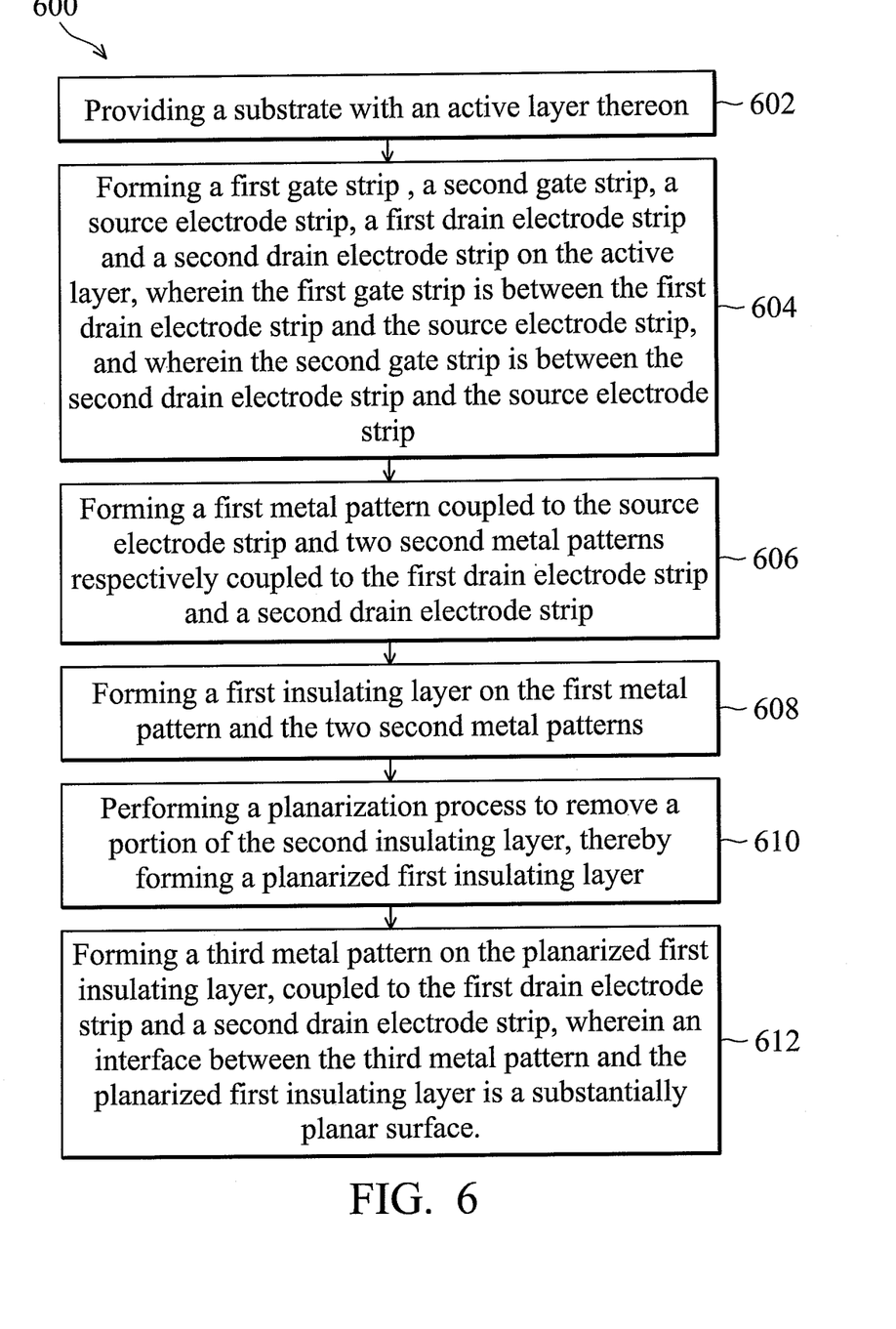
FIG. 6 is a flow chart of a method for fabricating a power semiconductor device as shown in FIGS. 1 and 2 in accordance with some embodiments of the disclosure.

FIG. 6 is a flow chart of a method 600 for fabricating a power semiconductor device 500a as shown in FIGS. 1 and 2 in accordance with some embodiments of the disclosure. Please refer to FIGS. 1, 2 and 6, in operation 602, a substrate 200 with an active layer 202 thereon is provided. In some embodiments, the substrate 200 includes a semiconductor substrate, such as a silicon substrate. In some embodiments, the active layer 202 formed on the top surface 201 of the substrate 200 includes a plurality of nitride-based semiconductor layers stacked on each other, and a conductive channel of high density 2-dimensional electric gas (2DEG). In some embodiments, the active layer 202 includes a gallium nitride layer and an aluminum gallium nitride layer disposed on the gallium nitride. In some embodiments, the active layer 202 is formed by a deposition process, for example, a chemical vapor deposition (CVD) process, another applicable process, or combinations thereof.

Afterwards, in operation 604, the gate electrodes 204a and 204b, a first electrode (source electrode) 206, and the second electrodes (drain electrodes) 208 and 210 are formed on the active layer 202 as shown in FIGS. 1, 2 and 6. In some embodiments, the first gate electrode 204a, the second gate electrode 204b, the source electrode 206, the first drain electrode 208 and the second drain electrode 210 each have a strip shape. For example, the first gate electrode 204a serves as a first gate electrode strip 204a. The second gate electrode 204b serves as a second gate electrode strip 204b. The source electrode 206 serves as a source electrode strip 206. The first drain electrode 208 and the second drain electrode 210 serves as a first drain electrode strip 208 and a second drain electrode strip 210, respectively. In some embodiments, the first gate electrode strip 204a, the second gate electrode strip 204b, the source electrode strip 206, the first drain electrode strip 208 and the second drain electrode strip 210 are formed extended along a direction pointed into or out of the figure. In some embodiments, the first gate electrode strip 204a, the second gate electrode strip 204b, the source electrode strip 206, the first drain electrode strip 208 and the second drain electrode strip 210 are parallel and separated from one another. The first gate electrode strip 204a is between the first drain electrode strip 208 and the source electrode strip 206. The second gate electrode strip 204b is between the second drain electrode strip 210 and the source electrode strip 206 as shown in FIGS. 1 and 2. In some embodiments, the first gate electrode strip 204a, the second gate electrode strip 204b, the source electrode strip 206, the first drain electrode strip 208 and the second drain electrode strip 210 are formed of conductive materials including polysilicon. In some embodiments, the first gate electrode strip 204a, the second gate electrode strip 204b, the source electrode strip 206, the first drain electrode strip 208 and the second drain electrode strip 210 are formed by a deposition process and a subsequent patterning process. The deposition process is used to deposit conductive materials on the active layer 202, including a chemical vapor deposition (CVD), physical vapor deposition (PVD), other applicable processes, or combinations thereof. The patterning process is used to remove a portion of the conductive materials to define the first gate electrode strip 204a, the second gate electrode strip 204b, the source electrode strip 206, the first drain electrode strip 208 and the second drain electrode strip 210. In some embodiments, the patterning process includes a photolithography process and a subsequent etching process.

Afterwards, an insulating layer 212 is formed over the active layer 202, the first gate electrode strip 204a, the second gate electrode strip 204b, the source electrode strip 206, the first drain electrode strip 208 and the second drain electrode strip 210 as shown in FIGS. 1, 2 and 6 in accordance with some embodiments. In some embodiments, the insulating layer 212 is formed of dielectric materials. For example, the insulating layer 212 includes silicon oxide or silicon nitride. In some embodiments, the insulating layer 212 is formed by a method including spin coating, chemical vapor deposition (CVD), physical vapor deposition (PVD), a thermal process, other applicable processes, or combinations thereof. In some other embodiments, a planarization process including a chemical mechanical polishing (CMP) process is performed on the insulating layer 212 to planarize a surface of the insulating layer 212

Afterwards, in operation 606, a first metal pattern 218 is formed over the insulating layer 212. Also, the first metal pattern 218 is formed through the insulating layer 212 to couple to the source electrode strip 206 as shown in FIGS. 1, 2 and 6 in accordance with some embodiments. Also, two second metal patterns 214 and 216 are formed through the insulating layer 212 to respectively couple to the first drain electrode strip 208 and the second drain electrode strip 210. In some embodiments, the first metal pattern 218 and second metal patterns 214 and 216 are formed of conductive materials, for example, aluminum (Al), copper (Cu) other applicable conductive materials or combinations thereof. In some embodiments, the first metal pattern 218 and second metal patterns 214 and 216 are formed by a patterning process and a subsequent plating process. The patterning process includes a photolithography process and a subsequent etching process. The patterning process is used to remove a portion of the insulating layer 212, thereby forming openings (not shown) through the insulating layer 212. Portions of the first electrode 206 and the second electrodes 208 and 210 are exposed to the openings. The photolithography process is used to define formation positions of the first metal pattern 218 and second metal patterns 214 and 216 over the insulating layer 220. The plating method includes an electro-plating process, electroless-plating process, other applicable processes or combinations thereof to deposit a conductive material over the insulating layer 220 and fill the openings.

Afterwards, in operation 608, an insulating layer 220 is formed on the first metal pattern 218 and the two second metal patterns 214 and 216 as shown in FIGS. 1, 2 and 6 in accordance with some embodiments. In some embodiments, the insulating layer 220 is formed of dielectric materials. For example, the insulating layer 220 includes insulating materials such as silicon oxide, silicon nitride, other applicable insulating materials, or combinations thereof. In some embodiments, the insulating layer 220 is formed by a deposition process and a subsequent planarization process. The deposition process, which is used to deposit the insulating materials, includes spin coating, chemical vapor deposition (CVD), physical vapor deposition (PVD), a thermal process, other applicable processes, or combinations thereof.

Afterwards, in an operation 610, a planarization process is performed to remove a portion of the insulating layer 220, thereby forming a planarized insulating layer 220 as shown in FIGS. 1, 2 and 6 in accordance with some embodiments. In some embodiments, the planarization process is performed to remove uneven portions of the insulating layer 220 from a top surface thereof to ensure a top surface 224 of the insulating layer 220 is a substantially planar surface. The planarization process includes a chemical mechanical polishing (CMP) process, other applicable processes, or combinations thereof.

Afterwards, in operation 612, a third metal pattern 228 is formed on the top surface 224 of the planarized insulating layer 220, coupled to the first drain electrode strip 208 and the second drain electrode strip 210 as shown in FIGS. 1 and 6 in accordance with some embodiments. In some embodiments, the third metal pattern 228 is composed of a first portion 228-1 along a first direction 240 and a second portion 228-2 along a second direction 242 as shown in FIG. 1. In some embodiments, an interface (at the top surface 224 of the insulating layer 220) between the portion 228-1 of the third metal pattern 228 and the planarized insulating layer 220 is a substantially planar surface. In some embodiments, the third metal pattern 228 is formed of materials that are the same as those of the first metal pattern 218 and second metal patterns 214 and 216. In some embodiments, formation processes of the third metal pattern 228 are the same as those of the first metal pattern 218 and second metal patterns 214 and 216.

In some other embodiments, operation 612 includes forming a fourth metal pattern 226 on the planarized insulating layer 220, coupled to the source electrode strip 206 as shown in FIG. 2 in accordance with some embodiments. In some embodiments, the fourth metal pattern 226 is composed of a portion 226-1 along the first direction 240 and a portion 226-2 along the second direction 242 as shown in FIG. 2. In some embodiments, the interface (at the top surface 224 of the insulating layer 220) between the portion 226-1 of the fourth metal pattern 226 and the planarized insulating layer 220 is a substantially planar surface.

Figure 7:
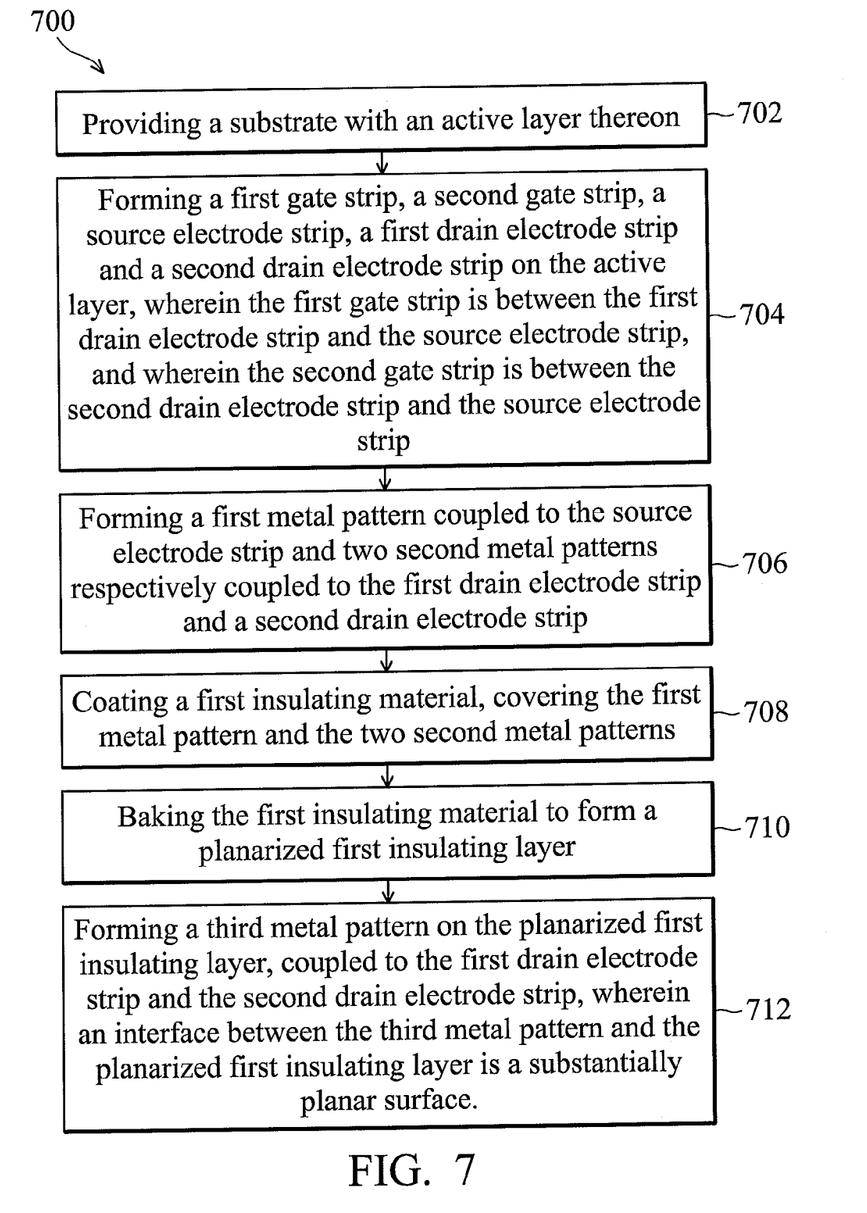
FIG. 7 is a flow chart of a method for fabricating a power semiconductor device as shown in FIGS. 3 and 4 in accordance with some embodiments of the disclosure.

FIG. 7 is a flow chart of a method 700 for fabricating a power semiconductor device as shown in FIGS. 3 and 4 in accordance with some embodiments of the disclosure. Please refer to FIGS. 3, 4 and 7: in operation 702, a substrate 200 with an active layer 202 thereon is provided. In some embodiments, the substrate 200 includes a semiconductor substrate, such as a silicon substrate. In some embodiments, the active layer 202 formed on the top surface 201 of the substrate 200 includes a plurality of nitride-based semiconductor layers stacked on each other, and a conductive channel of high density 2-dimensional electric gas (2DEG). In some embodiments, the active layer 202 includes a gallium nitride layer and an aluminum gallium nitride layer disposed on the gallium nitride. In some embodiments, the active layer 202 is formed by a deposition process, for example, a chemical vapor deposition (CVD) process, another applicable process, or combinations thereof.

Afterwards, in operation 704, the gate electrodes 204a and 204b, a first electrode (source electrode) 206, and the second electrodes (drain electrodes) 208 and 210 are formed on the active layer 202 as shown in FIGS. 3, 4 and 7. In some embodiments, the first gate electrode 204a, the second gate electrode 204b, the source electrode 206, the first drain electrode 208 and the second drain electrode 210 each have a strip shape extended along a direction pointed into or out of the figure. For example, the first gate electrode 204a serves as a first gate electrode strip 204a. The second gate electrode 204b serves as a second gate electrode strip 204b. The source electrode 206 serves as a source electrode strip 206. The first drain electrode 208 and the second drain electrode 210 serves as a first drain electrode strip 208 and a second drain electrode strip 210, respectively. In some embodiments, the first gate electrode strip 204a, the second gate electrode strip 204b, the source electrode strip 206, the first drain electrode strip 208 and the second drain electrode strip 210 are parallel and separated from one another. The first gate electrode strip 204a is between the first drain electrode strip 208 and the source electrode strip 206. The second gate electrode strip 204b is between the second drain electrode strip 210 and the source electrode strip 206, as shown in FIGS. 3 and 4. In some embodiments, formation processes of the first gate electrode strip 204a, the second gate electrode strip 204b, the source electrode strip 206, the first drain electrode strip 208 and the second drain electrode strip 210 are the same as operation 604 as shown in FIG. 6.

Afterwards, an insulating layer 212 is formed over the active layer 202, the first gate electrode strip 204a, the second gate electrode strip 204b, the source electrode strip 206, the first drain electrode strip 208 and the second drain electrode strip 210 as shown in FIGS. 3, 4 and 7 in accordance with some embodiments. In some embodiments, formation processes of the insulating layer 212 are the same as the aforementioned description relating to FIGS. 1, 2 and 6.

Afterwards, in operation 706, a first metal pattern 218 is formed over the insulating layer 212. Also, the first metal pattern 218 is formed through the insulating layer 212 to couple to the source electrode strip 206 as shown in FIGS. 3, 4 and 7 in accordance with some embodiments. Also, two second metal patterns 214 and 216 are formed through the insulating layer 212 to respectively couple to the first drain electrode strip 208 and the second drain electrode strip 210. In some embodiments, formation processes of the first metal pattern 218, the second metal patterns 214 and 216 are the same as operation 606 as shown in FIG. 6.

Afterwards, an insulating layer 320 is disposed formed over the first metal pattern 218 and second metal patterns 214 and 216 as shown in FIGS. 3, 4 and 7 in accordance with some embodiments. Also, the insulating layer 320 is disposed over the insulating layer 212. In some embodiments, formation processes of the insulating layer 320 are the same as the aforementioned description relating to FIGS. 1, 2 and 6. In some embodiments, a thickness H4 of a portion of the insulating layer 320 over the second metal patterns 214 and 216 is designed to be the same as the thickness H2 of the first electrode 206 metal pattern 218 and the second metal patterns 214 and 216. Also, the thickness H4 is designed to be the same as the thickness H1 of the first electrode 206 and the second metal patterns 214 and 216 insulating layer 212. Therefore, a top surface 321 of the insulating layer 320 may have an uneven profile conforming to a profile of the first metal pattern 218 and the second metal patterns 214, 216. In some embodiments, the insulating layer 320 has one or more recess 323 close to the top surface 321.

Afterwards, in operation 708, an insulating material for formation of a subsequently formed insulating layer 322 is coated covering the first metal pattern 218 and the two second metal patterns 214, 216 as shown in FIGS. 3, 4 and 7 in accordance with some embodiments. In some embodiments, the insulating material is coated covering the insulating layer 320, fully filling the recess 323 of the insulating layer 320 in accordance with some embodiments.

Afterwards, in operation 710, the insulating material is baked to form a planarized insulating layer 322 as shown in FIGS. 3, 4 and 7 in accordance with some embodiments. A thickness of the insulating layer 322 is controlled such that a top surface 324 of the insulating layer 322 is a substantially planar surface.

Afterwards, in operation 712, a third metal pattern 228 is formed on the planarized insulating layer 322, coupled to the first drain electrode strip 208 and the second drain electrode strip 210 as shown in FIGS. 3, and 7 in accordance with some embodiments. In some embodiments, the third metal pattern 228 is composed of a first portion 228-1 along a first direction 240 and a second portion 228-2 along a second direction 242 as shown in FIG. 3. In some embodiments, an interface (at the top surface 324 of the insulating layer 322) between the portion 228-1 of the third metal pattern 228 and the planarized insulating layer 322 is a substantially planar surface. In some embodiments, the third metal pattern 228 is formed of materials that are the same as those of the first metal pattern 218 and second metal patterns 214 and 216. In some embodiments, formation processes of the third metal pattern 228 are the same as those of the first metal pattern 218 and second metal patterns 214 and 216.

In some other embodiments, operation 712 includes forming a fourth metal pattern 226 on the planarized insulating layer 220, coupled to the source electrode strip 206 as shown in FIGS. 4 and 6 in accordance with some embodiments. In some embodiments, the fourth metal pattern 226 is composed of a portion 226-1 along the first direction 240 and a portion 226-2 along the second direction 242 as shown in FIG. 4. In some embodiments, the interface (at the top surface 324 of the insulating layer 322) between the portion 226-1 of the fourth metal pattern 226 and the planarized insulating layer 322 is a substantially planar surface.

In some embodiments, a power semiconductor device and a method for fabricating the same are provided. The power semiconductor device includes a gate electrode, a source electrode and a drain electrode. In some embodiments, an insulating layer covering the gate electrode, the source electrode and the drain electrode is formed with a planarized surface by a planarization process. In some other embodiments, the insulating layer is formed with the planarized surface by a coating and a subsequent baking method. Therefore, an interface between the source metal pattern and/or the drain metal pattern and the underlying insulating layer (for example, interlayer dielectric (ILD) or inter-metal dielectric (IMD)), except for the portion formed through the insulating layer, is a substantially planar surface. Therefore, the source metal pattern and the drain metal pattern can be designed to have a wider dimension (for example, a width and/or a thickness) for large current transmission requirements without point discharge occurring between the source metal pattern and the drain metal pattern.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A power semiconductor device, comprising:
a substrate;
an active layer disposed on the substrate;
a gate electrode disposed on the active layer;
a first electrode and a second electrode disposed on the active layer, on opposite sides of the gate electrode;
a first metal pattern coupled to the first electrode;
a second metal pattern coupled to the second electrode;
a first insulating layer disposed on the first and second metal patterns;
a second insulating layer directly contacting the gate electrode, and the first and second electrodes, wherein the gate electrode is separated from the first metal pattern by the second insulating layer; and
a third metal pattern covering the first insulating layer, coupled to the second metal pattern,
wherein an interface between the third metal pattern and the first insulating layer is a substantially planar surface, and
wherein the first metal pattern directly contacts a top surface of the first electrode and the second insulating layer, and overlaps with the gate electrode.

2. The power semiconductor device as claimed in claim 1, wherein the third metal pattern is composed of a first portion and a second portion, wherein the first portion is extended along a first direction substantially parallel to a top surface of the first insulating layer, and the second portion is extended along a second direction substantially perpendicular to the first direction.

3. The power semiconductor device as claimed in claim 1, wherein the first electrode is a source electrode, and the second electrode is a drain electrode.

4. The power semiconductor device as claimed in claim 1, wherein a top surface of the first insulating layer is a planar surface.

5. The power semiconductor device as claimed in claim 1, wherein the first metal pattern completely overlaps with the gate electrode.

6. The power semiconductor device as claimed in claim 1, wherein the first and second metal patterns belong to a first metal-layered level.

7. The power semiconductor device as claimed in claim 6, wherein the third metal pattern belong to a second metal-layered level different from the first metal-layered level.

8. The power semiconductor device as claimed in claim 7, wherein the second metal-layered level is higher than the first metal-layered level.

9. The power semiconductor device as claimed in claim 1, wherein the third metal pattern overlaps with the gate electrode and the first metal pattern.

10. The power semiconductor device as claimed in claim 1, wherein the first metal pattern is vertically between the gate electrode and the third metal pattern.

11. The power semiconductor device as claimed in claim 1, further comprising a fourth metal pattern disposed on the first insulating layer and coupled to the first metal pattern.

12. The power semiconductor device as claimed in claim 1, further comprising a third insulating layer covering the first and second metal patterns, underlying the first insulating layer.

13. The power semiconductor device as claimed in claim 1, wherein the first insulating layer is formed of insulating materials comprising benzocyclobutene (BCB), spin on glass (SOG), polyimide (PI), photoresist (PR) or combinations thereof.

14. A method for fabricating the power semiconductor device as set forth in claim 1, comprising:
providing the substrate with the active layer thereon;
forming a first gate electrode strip, a second gate electrode strip, a source electrode strip, a first drain electrode strip and a second drain electrode strip on the active layer, wherein the first gate electrode strip is between the first drain electrode strip and the source electrode strip, and wherein the second gate electrode strip is between the second drain electrode strip and the source electrode strip;
forming the first metal pattern coupled to the source electrode strip and two second metal patterns respectively coupled to the first drain electrode strip and a second drain electrode strip;
forming the first insulating layer on the first metal pattern and the two second metal patterns;
performing a planarization process to remove a portion of the first insulating layer, thereby forming a planarized first insulating layer;
forming the third metal pattern on the planarized first insulating layer, coupled to the first drain electrode strip and the second drain electrode strip, wherein an interface between the third metal pattern and the planarized first insulating layer is a substantially planar surface; and
forming the second insulating layer on the active layer, covering the first and second gate electrode strips, the source electrode strip and the first and second drain electrode strips before forming the first metal pattern and the two second metal patterns, wherein the first and second gate electrode strips are both separated from the first metal pattern by the second insulating layer,
wherein the first metal pattern directly contacts a top surface of the source electrode strip and the second insulating layer, and overlaps with the first and second gate electrode strips.

15. The method for fabricating a power semiconductor device as claimed in claim 14, wherein the first gate electrode strip, the second gate electrode strip, the source electrode strip, the first drain electrode strip and the second drain electrode strip are parallel and separated from one another.

16. The method for fabricating a power semiconductor device as claimed in claim 14, further comprising forming a fourth metal pattern on the planarized first insulating layer, coupled to the source electrode strip, wherein an interface between the fourth metal pattern and the planarized first insulating layer is a substantially planar surface.

17. A method for fabricating the power semiconductor transistor device as set forth in claim 1, comprising:
providing the substrate with the active layer thereon;
forming a first gate electrode strip, a second gate electrode strip, a source electrode strip, a first drain electrode strip and a second drain electrode strip on the active layer, wherein the first gate electrode strip is between the first drain electrode strip and the source electrode strip, and wherein the second gate electrode strip is between the second drain electrode strip and the source electrode strip;
forming the first metal pattern coupled to the source electrode strip and two second metal patterns respectively coupled to the first drain electrode strip and a second drain electrode strip;
coating the first insulating material, covering the first metal pattern and the two second metal patterns;
baking the first insulating material to form a planarized first insulating layer;
forming the third metal pattern on the planarized first insulating layer, coupled to the first drain electrode strip and a second drain electrode strip, wherein an interface between the third metal pattern and the planarized first insulating layer is a substantially planar surface; and
forming the second insulating layer on the active layer, covering the first and second gate electrode strips, the source electrode strip and the first and second drain electrode strips before forming the first metal pattern and the two second metal patterns, wherein the first and second gate electrode strips are both separated from the first metal pattern by the second insulating layer,
wherein the first metal pattern directly contacts a top surface of the source electrode strip and the second insulating layer, and overlaps with the first and second gate electrode strips.

18. The method for fabricating a power semiconductor device as claimed in claim 17, wherein the first gate electrode strip, the second gate electrode strip, the source electrode strip, the first drain electrode strip and the second drain electrode strip are parallel and separated from one another.

19. The method for fabricating a power semiconductor device as claimed in claim 17, further comprising forming a fourth metal pattern on the planarized first insulating layer, coupled to the source electrode strip, wherein an interface between the fourth metal pattern and the planarized first insulating layer is a substantially planar surface.

20. The method for fabricating a power semiconductor device as claimed in claim 17, further comprising forming a third insulating layer covering the first metal pattern and the two second metal patterns, underlying the first insulating layer before forming the first insulating layer.

21. The method for fabricating a power semiconductor device as claimed in claim 17, wherein the first insulating layer is formed of an insulating material comprising benzocyclobutene (BCB), spin on glass (SOG), polyimide (PI), photoresist (PR) or combinations thereof.

* * * * *